(12) United States Patent
Chen

(10) Patent No.: US 8,045,374 B2
(45) Date of Patent: Oct. 25, 2011

(54) ERASE VERIFICATION METHOD OF FLASH MEMORY BY SELECTIVELY ASSIGNING DESELECTED SECTORS

(75) Inventor: Chung-Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 128 days.

(21) Appl. No.: 12/689,235

(22) Filed: Jan. 19, 2010

(65) Prior Publication Data

US 2011/0176369 A1    Jul. 21, 2011

(51) Int. Cl.
*G11C 16/34* (2006.01)
(52) U.S. Cl. ......... 365/185.02; 365/185.22; 365/185.33; 365/185.29; 365/185.12; 365/185.11
(58) Field of Classification Search ............ 365/185.22, 365/185.33, 185.29, 185.12, 185.11, 185.24, 365/185.02
See application file for complete search history.

(56) References Cited

U.S. PATENT DOCUMENTS

| 5,359,558 | A  | * | 10/1994 | Chang et al. ............... 365/185.3 |
| 7,468,916 | B2 | * | 12/2008 | Chen ........................ 365/185.23 |
| 7,835,201 | B2 | * | 11/2010 | De Sandre et al. ...... 365/189.11 |
| 2007/0279999 | A1 | | 12/2007 | Watanabe et al. |

* cited by examiner

*Primary Examiner* — Andrew Q Tran
(74) *Attorney, Agent, or Firm* — Jianq Chyun IP Office

(57) ABSTRACT

A suitable erase verification (ERSV) method of a flash memory apparatus is provided, which is different from the conventional ERSV method. That is, by managing the ERSV operation on the flash memory after at least once of erase operation, a flash memory controller in the flash memory apparatus selectively assigns at least one of de-selected sectors instead of all of the de-selected sectors to perform the ERSV. Therefore, by managing the ERSV operation on the flash memory, the time for the ERSV operation thereon is reduced.

8 Claims, 3 Drawing Sheets

ERASE VERIFICATION METHOD OF FLASH MEMORY BY SELECTIVELY ASSIGNING DESELECTED SECTORS

BACKGROUND OF THE INVENTION

1. Field of the Invention

The invention relates to an erase verification method, and more particularly to an erase verification method of a serial flash memory for reducing the time of erase verification.

2. Description of Related Art

A flash memory is usually divided into a plurality of physical blocks, and for the convenience of description, these physical blocks will be referred as blocks thereinafter. Each bit in a block of a flash memory can only be programmed from "1" to "0". Accordingly, an erasing operation has to be performed before writing data to a memory address which contains old data. Each block is usually divided into a plurality of sectors, and each sector is the smallest programming unit. Namely, each sector is the smallest unit for writing or reading data, such as in a single level cell (SLC) NAND flash memory having the number of program (NOP) as 4.

For a serial flash memory, multiple sectors share a Pwell for saving chip area since sector area is small. Unfortunately, sharing the same Pwell has the so-called "Pwell disturbance" problem. When an erase (ERS) pulse is applied to the multiple sectors sharing the same Pwell, the Pwell is biased a specific voltage about 7V, so that the selected sectors and the de-selected sectors both have the same bias voltage. In the meanwhile, word lines corresponding to the selected sectors have a negative voltage about −9V, but word lines corresponding to the de-selected sectors have a positive voltage about 2V or zero voltage. Due to the same bias voltage on the Pwell during ERS, the electrons existing in the de-selected sectors may also be gradually lost, so that there is disturbance on the de-selected sectors. Accordingly, every time a flash memory sector is erased, there is always a possibility that threshold voltage of flash memory cells thereof becomes lower.

FIG. 1 is a flowchart of a conventional method for erasing multiple sectors sharing a Pwell. It is noted that the de-selected sector i represents the i-th de-selected sector, and this definition is also applied on the other description in the specification. Firstly, the erase pulse is applied to a selected sector or selected sectors of the multiple sectors in step S110. As known from above, an erase verification (ERSV) is needed for sequentially checking the threshold voltage of the flash memory cells in the de-selected sector if the threshold voltage of the flash memory cells is higher than a predetermined voltage such as about 3V. This is achieved by measuring current during ERSV. If current from the cell can be measured, it means the threshold voltage of the cell is lower than 3V. In step S120, the ERSV is sequentially performed on all of de-selected sectors to check state of the de-selected sector.

If the ERSV reads a program state (or a "0" state) in step S120, the de-selected sector i passes the ERSV, which means the floating gate of the cell has electrons existing therein. After that, the flow goes to the next step S150 where the index of the de-selected sector from i to i+1. While the index of the de-selected sector is maximum in step S160, the method terminates. Otherwise, the flow returns to the step S120, where the ERSV will be perform on the next de-selected sector. If the ERSV fails to read the program state, it means the de-selected sector i has a Pwell disturbance, and thus a program verification (PGMV) is performed on the de-selected sector i to check for bit line leakage in the de-selected sector i in step S130. If the check result fails in step S130, it means the de-selected sector i has bit line leakage, and then a re-program is performed on the de-selected sector i to fix the leakage in the de-selected sector i in step S140. After the re-program, the de-selected sector i is verified again in step S130. The loop of steps S130 and S140 is repeated until the de-selected sectors i is completely fixed. Now all of the de-selected sectors have passed the ERSV in step S120 and the PGMV in step S130, and the flow of the method terminates.

This method is used in general to eliminate the Pwell disturbance due to the erasing operation in serial flash memory before another erase pulse is applied. However, it is possible that the de-selected sectors suffer from no Pwell disturbance after one time of the ERS, but the ERSV is still performed on all of the de-selected sectors again and again every time. A lot of time would be wasted in such a situation.

SUMMARY OF THE INVENTION

Accordingly, the invention is directed to provide a flash memory apparatus and an erase verification method thereof for reducing the time of erase verification.

According to one exemplary embodiment consistent with the invention, there is provided an erase verification method of a flash memory apparatus. The erase verification method includes the following steps: (1) providing at least one flash memory having a plurality of sectors organized in different blocks; (2) counting a number of the erasing operation times on the selected sector or the selected sectors; (3) selectively assigning at least one of the de-selected sectors instead of all of the de-selected sectors to perform the ERSV while the number of the erasing operation times is larger than a predetermined number; (4) performing a program verification (PGMV) on the assigned de-selected sector to check for bit line leakage in the assigned de-selected sector while the assigned de-selected sector is not a program state; (5) performing a re-program on the assigned de-selected sector to fix the bit line leakage in the assigned de-selected sector while the assigned de-selected sector fails in PGMV. The order of the above steps is not used to limit the scope of the invention.

The embodiment of the invention provides a suitable ERSV method, which is different from the conventional ERSV method. That is, by managing the ERSV operation on the flash memory after at least once of the ERS, a flash memory controller in the flash memory selectively assigns one or parts of de-selected sectors instead of all of the de-selected sectors to perform the ERSV. Therefore, by managing the ERSV operation on the flash memory, the time for the ERSV operation thereon is reduced.

In order to make the features and advantages of the invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
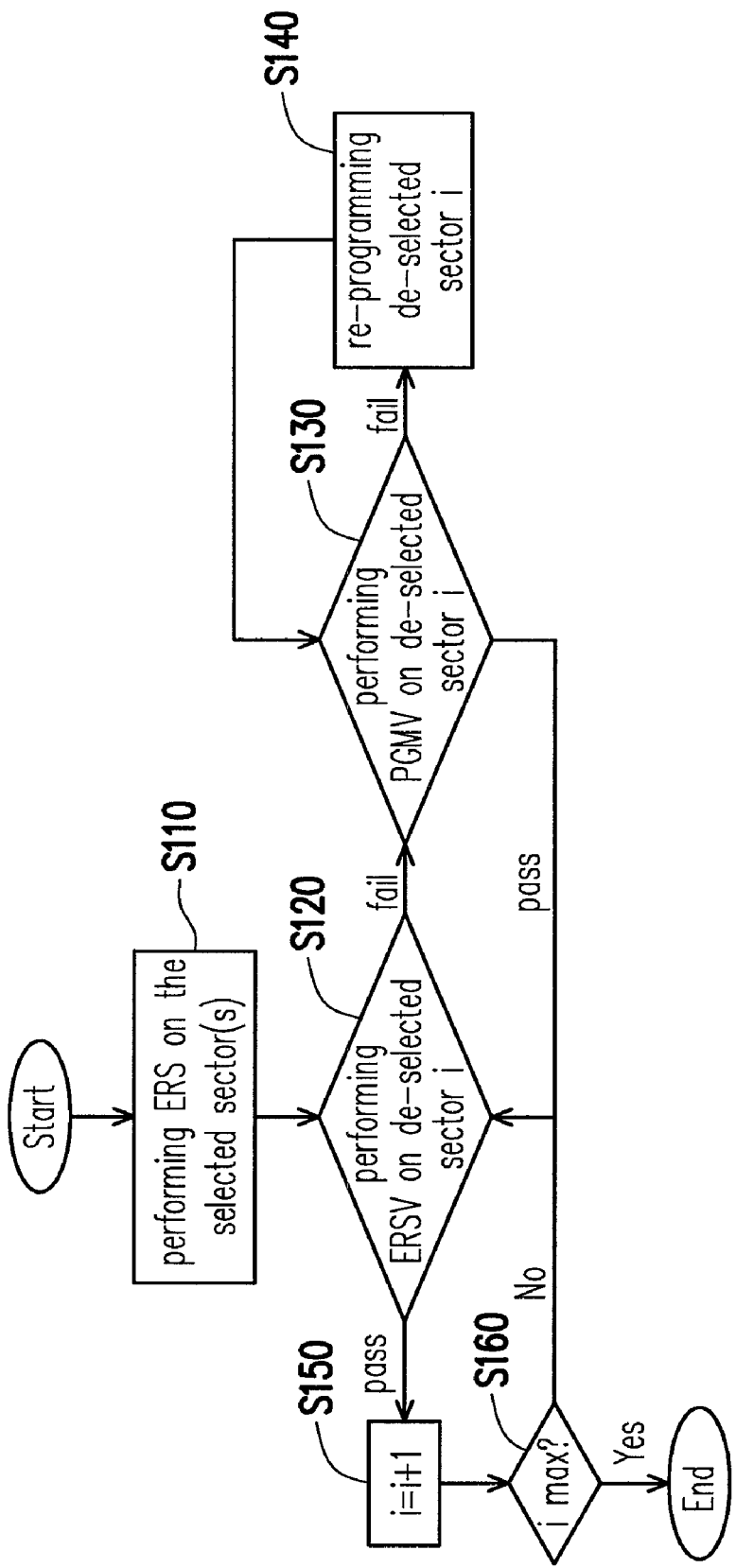
FIG. 1 is a flowchart of a conventional method for erasing multiple sectors sharing a Pwell.
Figure 2:
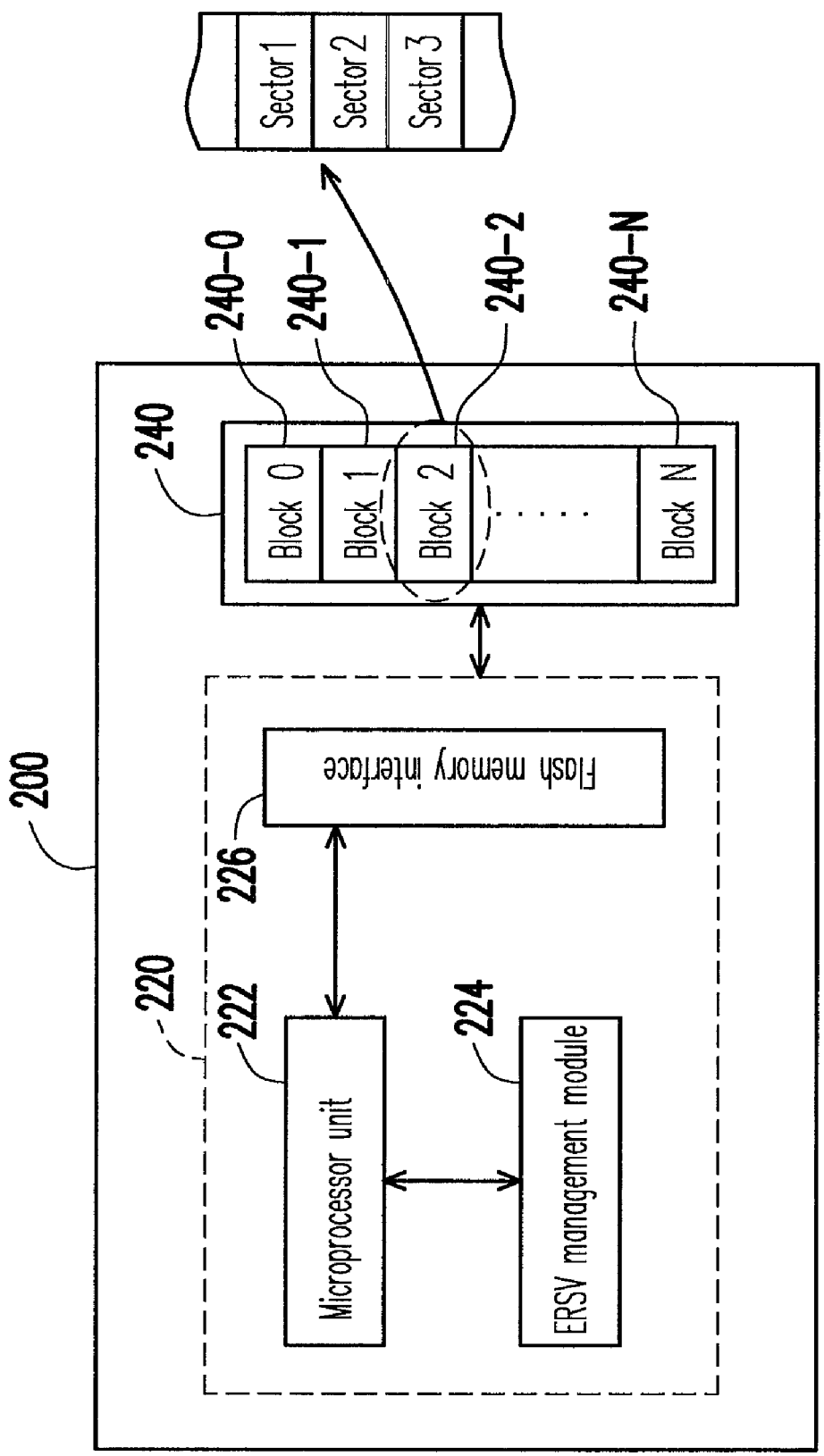
FIG. 2 is a block diagram of a flash memory apparatus according to one embodiment of the invention.

FIG. 2 is a block diagram of a flash memory apparatus according to one embodiment of the invention. Referring to FIG. 2, the flash memory apparatus 200 includes a flash memory controller 220 and a serial flash memory 240. The flash memory controller 220 is electrically connected to the serial flash memory 240 for controlling the operation of the serial flash memory 240 and executing an erase verification (ERSV) method on the serial flash memory 240. Herein, the type of the flash memory is exemplary, but the invention is not limited thereto.

The serial flash memory 240 is electrically connected to the flash memory controller 220 and used for storing data. The serial flash memory 240 is substantially divided into a plurality of physical blocks 240-0~240-N, and for the convenience of description, these physical blocks will be referred as blocks thereinafter. Generally speaking, block is the smallest unit for erasing data in a flash memory. In other words, each block contains the smallest number of memory cells which are erased together. Each block is usually divided into a plurality of pages. Page is the smallest programming unit. However, it has to be noted that the smallest programming unit may also be sector in flash memory designs. Namely, a page is further divided into a plurality of sectors and each sector is considered the smallest programming unit. Herein, taking one sector considered the smallest programming unit as an example, but the invention is not limited thereto. In other words, sector is the smallest unit for writing or reading data in the embodiment. Namely, a page is a sector. However, a page may also be composed of multiple sectors in other embodiments. For example, a page may include four sectors. In this embodiment, the serial flash memory 240 has multiple sectors sharing a Pwell for saving chip area since sector area is small. For example, there may be sixteen sectors sharing a Pwell in this embodiment, but the invention is not limited thereto.

Referring to FIG. 2 again, the flash memory controller 220 includes a microprocessor unit 222, an ERSV management module 224, and a flash memory interface 226. The flash memory interface 226 is electrically connected to the microprocessor unit 222 and is used for accessing the serial flash memory 240. Namely, the data to be written by the microprocessor unit 222 is first converted by the flash memory interface 226 into a format acceptable to the serial flash memory 240. The microprocessor unit 222 is used for controlling operations of other components in the flash memory controller 240. People ordinarily skilled in the art realize the operation of the said components 222 and 226 in the flash memory apparatus 200, so that details related to the connection between the said components 222 and 226 in the flash memory apparatus 200 are not described herein.

The ERSV management module 224 is electrically connected to the microprocessor unit 240 and is used for executing the ERSV on the serial flash memory 240. After erasing the memory blocks for at least once, the ERSV management module 224 selectively assigns one or parts of de-selected sectors to perform the ERSV instead of assigning all of the de-selected sectors to perform the ERSV. In this embodiment, it is possible that the de-selected sectors assigned by the ERSV management module 224 are not in the same blocks. However, it is also possible that the de-selected sectors assigned by the ERSV management module 224 are all in the same blocks. By managing the ERSV operation on the serial flash memory 240, the time for the ERSV operation thereon is reduced.

Figure 3:
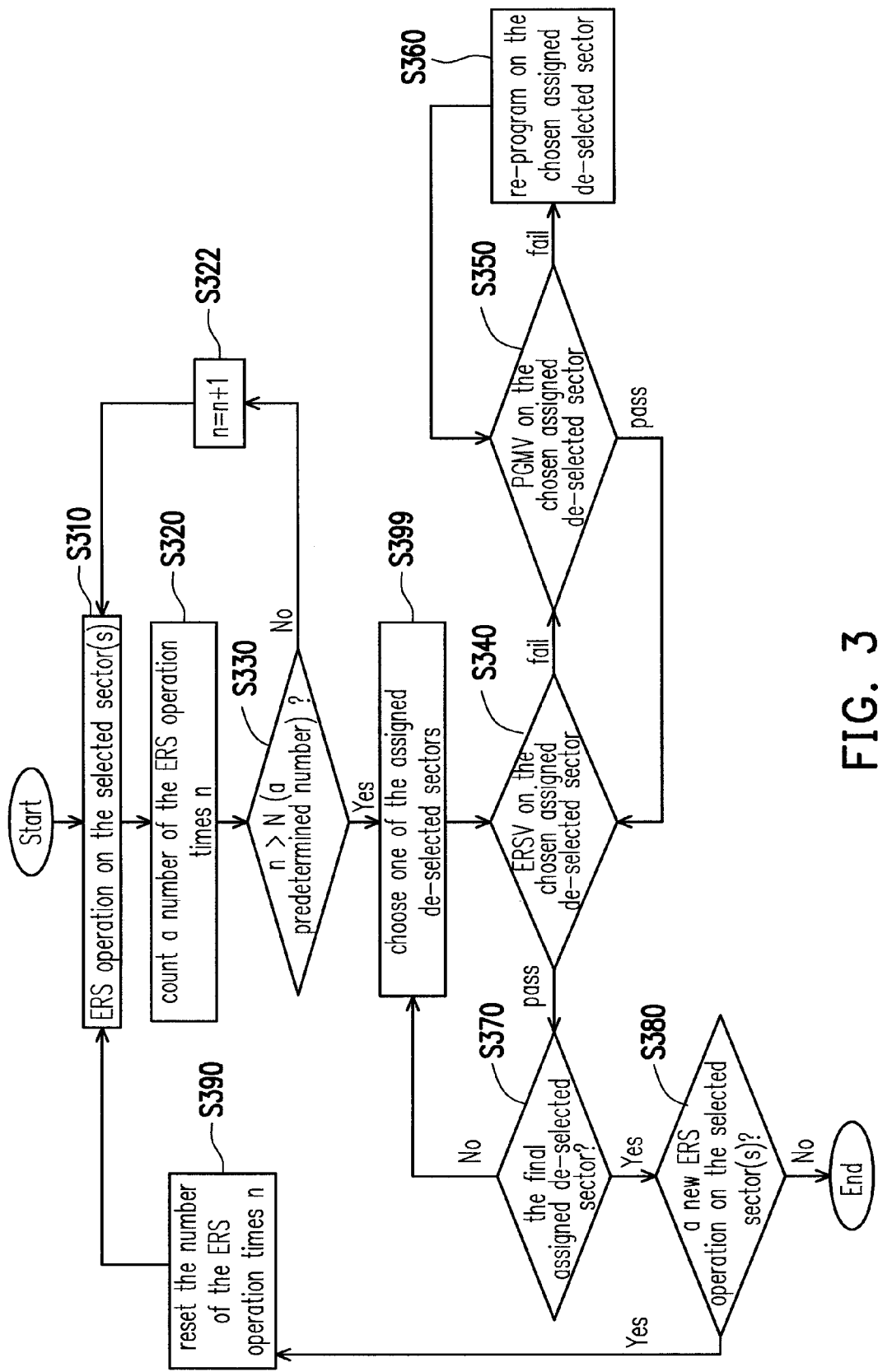
FIG. 3 is a flowchart of an ERSV method according to one embodiment of the invention.

FIG. 3 is a flowchart of an ERSV method according to one embodiment of the invention. Referring to FIG. 3, in step S310, an erase (ERS) pulse is applied to sectors selected from the blocks. To be more specific, each bit in a block of a flash memory can only be programmed from "1" to "0". Accordingly, the erasing operation has to be performed before writing data to a memory address which contains old data. After the ERS operation, the ERSV management module 224 counts a number of the ERS operation times n in step S320. If the number of the ERS operation times n is smaller than a predetermined number N in step 330, the flow will go back to the step S310, and the number of the ERS operation times becomes to n+1 from n in step S332. Accordingly, the ERS pulse is still applied to the selected sectors in step S310. The loop of steps S310 through S330 is repeated until the number of the ERS operation times n is larger than the predetermined number N. After the times n is larger than the predetermined number N, there is always a possibility that threshold voltage of the flash memory cells becomes lower. Then in step S399, one of the assigned de-selected sectors is chosen, and herein the chosen assigned de-selected sector is the assigned de-selected sector $j_m$. It is noted that the de-selected sector $j_m$ represents the $j_m$-th de-selected sector, and this definition is also applied on the other description in the specification. In step S340, the ERSV is performed on the assigned de-selected sector $j_m$. Accordingly, the ERSV is needed and is selectively performed on one or parts of de-selected sectors assigned by the ERSV management module 224 to check states of the assigned de-selected sectors in the loop formed by steps S340, S370, and S399.

To be more specific, it is possible that not all of the de-selected sectors suffer from Pwell disturbance after once or many times of the ERS operation. Accordingly, the flash memory apparatus 200 in the embodiment of FIG. 2 provides the suitable ERSV method. That is, by managing the ERSV operation on the serial flash memory 240, the ERSV management module 224 selectively assigns one or parts of de-selected sectors instead of all of the de-selected sectors to perform the ERSV after at least once of the ERS operation.

Referring to FIG. 3 again, if the ERSV fails to read a program state in step S340, it means the assigned de-selected sector $j_m$ has the Pwell disturbance, and thus a program verification (PGMV) is performed on the assigned de-selected sector $j_m$ to check for bit line leakage in the assigned de-selected sector $j_m$ in step S350. If the check result fails in step S350, it means the assigned de-selected sector $j_m$ has bit line leakage, and then a re-program is performed on the assigned de-selected sector $j_m$ to fix the leakage in the assigned de-selected sector $j_m$ in step S360. After the re-program, the assigned de-selected sector $j_m$ is verified again in step S350. The loop of steps S350 and S360 is repeated until the assigned de-selected sector $j_m$ is completely fixed.

On the contrary, if the ERSV reads the program state in step S340, it means the assigned de-selected sector $j_m$ passes the ERSV. Namely, the assigned de-selected sector $j_m$ suffers from no Pwell disturbance after several times of the ERS. In the meanwhile, the ERSV management module 224 registers the address of the de-selected sector $j_m$ to prevent the same de-selected sector from performing the ERSV again. It should be noted that after the assigned de-selected sector $j_m$ passes the ERSV, the ERSV management module 224 will check the assigned de-selected sector $j_m$ if it is the final assigned de-selected sector in the step S370. If the assigned de-selected sector $j_m$ is not the final assigned de-selected sector, the flow returns to the step S399, and then another one of the assigned de-selected sector is chosen, and then the ERSV is performed on the chosen assigned de-selected sector.

In this embodiment, the assigned de-selected sectors are selectively assigned by the ERSV management module 224 according to designers. To be more specific, it is possible that not all of the de-selected sectors suffer from the Pwell disturbance after several times of the ERS operation. Accordingly, the ERSV management module 224 selectively assigns one or parts of de-selected sectors instead of all of the de-selected sectors to perform the ERSV according to designers. Besides, the de-selected sectors assigned by the ERSV management module 224 may belong to different blocks.

Now all of the assigned de-selected sectors have passed the ERSV in step S340 and the PGMV in step S350, and then in step 380, the ERSV management module 224 will check if there is a new erasing operation to be performed. If no new erasing operation is to be performed, the flow of the ERSV method terminates. Otherwise, the ERSV management module 224 resets the number of the ERS operation times n in the step S390, and thus the ERSV method flow is repeated.

To sum up, it is possible that the de-selected sectors suffer from no Pwell disturbance, or not all of the de-selected sectors suffer from Pwell disturbance after one time of the ERS operation. Accordingly, the flash memory apparatus in the embodiment of the invention provides a suitable ERSV method. That is, by managing the ERSV operation on the serial flash memory 240 after at least once of the ERS operation, the ERSV management module selectively assigns one or parts of de-selected sectors instead of all of the de-selected sectors to perform the ERSV. Additionally, the assigned de-selected sectors may belong to different blocks. Therefore, by managing the ERSV operation on the serial flash memory, the time for the ERSV operation thereon is reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An erase verification method of a flash memory apparatus, comprising:
    providing at least one flash memory having a plurality of sectors organized in different blocks;
    counting a number of erasing operation times on the selected sector or the selected sectors;
    selectively assigning at least one of the de-selected sectors instead of all of the de-selected sectors to perform the erase verification (ERSV) while the number of the erasing operation times is larger than a predetermined number;
    performing a program verification (PGMV) on the assigned de-selected sector to check for bit line leakage in the assigned de-selected sector while the assigned de-selected sector is not a program state; and
    performing a re-program on the assigned de-selected sector to fix the bit line leakage in the assigned de-selected sector while the assigned de-selected sector fails in PGMV.

2. The erase verification method as claimed in claim 1, wherein in the step of performing the ERSV on the assigned de-selected sectors, the assigned de-selected sectors not belong to the same block.

3. The erase verification method as claimed in claim 1, wherein in the step of performing the ERSV on the assigned de-selected sectors, all of the assigned de-selected sectors belong to the same block.

4. The erase verification method as claimed in claim 1, wherein in the step of performing the ERSV on the assigned de-selected sectors, addresses of the assigned de-selected sectors are registered.

5. The erase verification method as claimed in claim 1, wherein in the step of performing the ERSV on the assigned de-selected sectors, while the assigned de-selected sector is a program state, the assigned de-selected sector is passed.

6. The erase verification method as claimed in claim 1, wherein in the steps of performing the PGMV and the re-program, performing the loop of the PGMV and the re-program until the assigned de-selected sector passes the PGMV.

7. The erase verification method as claimed in claim 1, wherein before the step of counting the number of the erasing operation times, resetting the number of the erasing operation times.

8. The erase verification method as claimed in claim 1, wherein the flash memory is a serial flash memory.

* * * * *